United States Patent
Pu et al.

(10) Patent No.: US 12,495,673 B2
(45) Date of Patent: Dec. 9, 2025

(54) DISPLAY PANEL AND DISPLAY DEVICE

(71) Applicants: Chongqing HKC Optoelectronics Technology Co., Ltd, Chongqing (CN); HKC Corporation Limited, Guangdong (CN)

(72) Inventors: Yang Pu, Chongqing (CN); Rongrong Li, Chongqing (CN)

(73) Assignees: CHONGQING HKC OPTOELECTRONICS TECHNOLOGY CO., LTD, Chongqing (CN); HKC CORPORATION LIMITED, Guangdong (CN)

( * ) Notice: Subject to any disclaimer, the term of this patent is extended or adjusted under 35 U.S.C. 154(b) by 442 days.

(21) Appl. No.: 18/089,390

(22) Filed: Dec. 27, 2022

(65) Prior Publication Data
US 2023/0380213 A1 Nov. 23, 2023

(30) Foreign Application Priority Data
May 23, 2022 (CN) .......................... 202210568383.7

(51) Int. Cl.
H10K 50/86 (2023.01)
H10K 59/12 (2023.01)

(52) U.S. Cl.
CPC ........... *H10K 50/865* (2023.02); *H10K 59/12* (2023.02)

(58) Field of Classification Search
CPC ........................... H10K 50/865; H10K 50/856
See application file for complete search history.

(56) References Cited

U.S. PATENT DOCUMENTS

| 2011/0084896 A1 | 4/2011 | Ito et al. |
| 2011/0157887 A1* | 6/2011 | Jeong ..................... G02B 5/201 |
| | | 362/235 |
| 2018/0190942 A1* | 7/2018 | Song ..................... H10K 59/879 |
| 2019/0326486 A1* | 10/2019 | Ting ..................... H10H 20/855 |
| 2022/0238606 A1* | 7/2022 | Jeong ................... H10K 50/865 |

FOREIGN PATENT DOCUMENTS

| CN | 102044635 A | 5/2011 |
| CN | 109638044 A | 4/2019 |
| CN | 110391324 A | 10/2019 |
| CN | 115280511 B | 6/2023 |

OTHER PUBLICATIONS

First Office Action dated Oct. 4, 2023 received German Patent Application No. DE 10 2023 108 970.6.
Notice of the Second Review Opinion dated Mar. 17, 2023 received in Chinese Patent Application No. CN 202210568383.7.

* cited by examiner

*Primary Examiner* — Erik Kielin
(74) *Attorney, Agent, or Firm* — Scully, Scott, Murphy & Presser, P.C.

(57) ABSTRACT

A display panel and a display device are provided in the disclosure. The display panel includes a carrier substrate, multiple emitting units disposed on the carrier substrate, and multiple light absorbing and reflecting assemblies. The multiple light absorbing and reflecting assemblies are disposed in correspondence with the multiple light emitting units and each of the multiple light absorbing and reflecting assemblies defines an opening, and where the light absorbing and reflecting assembly is configured to reflect at least part of light emitted by the light emitting unit to radiate through the opening, and to absorb external ambient light.

18 Claims, 5 Drawing Sheets

SECOND DIRECTION B

FIRST DIRECTION A

DISPLAY PANEL AND DISPLAY DEVICE

CROSS-REFERENCE TO RELATED APPLICATIONS

This application claims priority under 35 U.S.C. § 119(a) to Chinese Patent Application No. 202210568383.7, filed May 23, 2022, the entire disclosure of which is incorporated herein by reference.

TECHNICAL FIELD

This application relates to the field of display technologies, and particularly to a display panel and a display device.

BACKGROUND

With the development of photoelectric display technology and semiconductor manufacturing technology, displays with Thin Film Transistors (TFTs) have become more and more mature. For example, Thin Film Transistor Liquid Crystal Displays (TFT-LCDs) or Thin Film Transistor Organic Light Emitting Diodes (TFT-OLEDs) have been successfully mass-produced. OLED displays have obvious advantages in thickness, color saturation, contrast, flexible display, etc. The development of OLED displays has broad prospects.

In related technology, an OLED display generally uses top emission. An anode of a top emission-based OLED display is generally made of a totally reflective metal (ITO/Ag/ITO). To ensure the light output efficiency, a light emitting layer with a larger aperture ratio is adopted. However, due to the light emitting layer with a larger aperture ratio, external ambient light is irradiated on the anode metal, and thus the strong ambient light reflection is formed, affecting the display effect. To solve this problem, at present, a quarter-wave plate and a polarizer will be attached to the panel in sequence, such that the reflected light of the natural light cannot be radiated, so as to reduce the influence of the reflected light of the ambient light. Nonetheless, the light output efficiency will be reduced by half (the polarizer will absorb half of the light intensity of the output light). How to increase the light output efficiency of the display panel to a large extent and meanwhile reduce the influence of the reflected light of the ambient light has become a technical problem to be solved.

SUMMARY

In a first aspect, a display panel is provided in the disclosure. The display panel is applied to an Organic Light Emitting Diode (OLED). The display panel includes a carrier substrate, multiple light emitting units disposed on the carrier substrate, and multiple light absorbing and reflecting assemblies, where the multiple light absorbing and reflecting assemblies are disposed in correspondence with the multiple light emitting units and each of the multiple light absorbing and reflecting assemblies defines an opening, and where the light absorbing and reflecting assembly is configured to reflect at least part of light emitted by the light emitting unit to radiate through the opening, and further configured to absorb external ambient light.

In a second aspect, a display device is provided in the disclosure. The display device includes the display panel mentioned and a casing which carries the display panel.

BRIEF DESCRIPTION OF THE DRAWINGS

To describe technical solutions of implementations of the disclosure more clearly, the following will give a brief description of accompanying drawings used in the implementations. Apparently, accompanying drawings described below are merely some implementations of the disclosure. Those of ordinary skill in the art can also obtain other accompanying drawings based on the accompanying drawings without creative efforts.

Reference signs: display panel—1, casing—2, display device—1000, carrier substrate—10, light emitting unit—20, anode—21, light emitting layer—22, second light-absorbing member—23, light absorbing and reflecting assembly—30, support member—31, reflecting member—32, first light-absorbing member—33, opening—34, driving layer—40, buffer—41, gate insulating layer—42, gate layer—43, semiconductor layer—44, source—45, drain—46, interlayer insulating layer—47, planarization layer—48, Thin Film Encapsulation (TFE) layer—49, first encapsulation layer—491, organic layer—492, second encapsulation layer—493.

DETAILED DESCRIPTION

Technical solutions of implementations of the disclosure will be described clearly and completely with reference to accompanying drawings in the implementations of the disclosure. Apparently, implementations described herein are merely some implementations of the disclosure, rather than all implementations. Based on the implementations of the disclosure, all other implementations obtained by those of ordinary skill in the art without creative effort shall fall within the protection scope of the disclosure.

The term "embodiment" or "implementation" referred to herein means that particular features, structures, or properties described in conjunction with the embodiment or implementation may be contained in at least one embodiment or implementation of the disclosure. Terms appearing in various places in the specification does not necessarily refer to the same embodiment or implementation, nor is it an independent or alternative embodiment mutually exclusive with other embodiments or implementations. Those of ordinary skill in the art will understand expressly and implicitly that the embodiments or the implementations described herein can be combined with other embodiments or implementations.

It should be noted that, the terms "first", "second", and the like used in the specification, the claims, and the accompany drawings of the disclosure are used to distinguish different objects rather than describe a particular order. In addition, the terms "comprise" and "have" as well as variations thereof are intended to cover non-exclusive inclusion.

In the specification, for convenience of description, the words and sentences indicating directional relationship or positional relationship such as "center", "on", "under", "front", "back", "vertical", "horizontal", "top", "bottom", "in", "out", and the like are used to describe positional relationship of the constituent elements with reference to accompanying drawings and are only for the convenience of description and simplicity, rather than explicitly or implicitly indicate that apparatuses or components referred to herein must have a certain direction or be configured or operated in a certain direction and therefore cannot be understood as limitation on the disclosure. The positional relationship of the constituent elements can be changed appropriately according to the direction of the constituent elements described. Therefore, it is not limited to the words and sentences described in the specification, and can be appropriately replaced according to the situation.

Unless stated otherwise, in the specification, terms "installing", "coupling", "connecting" referred to herein should be understood in broader sense. For example, a coupling may be a fixed coupling, a removable coupling, or an integrated coupling, may be a mechanical coupling, an electrical coupling, and may be a direct coupling, an indirect coupling through a medium, or an interaction coupling between two components. For those of ordinary skill in the art, the above terms in the disclosure can be understood according to specific situations.

With the development of photoelectric display technology and semiconductor manufacturing technology, displays with Thin Film Transistors (TFTs) have become more and more mature. For example, Thin Film Transistor Liquid Crystal Displays (TFT-LCDs) or Thin Film Transistor Organic Light Emitting Diodes (TFT-OLEDs) have been successfully mass-produced. OLED displays have obvious advantages in the thickness, the color saturation, the contrast, the flexible display, etc. The development of OLED displays has broad prospects.

In related technology, an OLED display generally uses top emission. An anode of a top emission-based OLED display is generally made of a totally reflective metal (ITO/Ag/ITO). To ensure the light output efficiency, a light emitting layer with a larger aperture ratio is adopted. However, due to the light emitting layer with a larger aperture ratio, external ambient light is irradiated on the anode metal, thus the strong ambient light reflection is formed, affecting the display effect. To solve this problem, at present, a quarter-wave plate and a polarizer will be attached to the panel in sequence, such that the reflected light of the natural light cannot be radiated, so as to reduce the influence of the reflected light of the ambient light. Nonetheless, the light output efficiency will be reduced by half (the polarizer will absorb half of the light intensity of the output light). How to increase the light output efficiency of the display panel to a large extent and meanwhile reduce the influence of the reflected light of the ambient light has become a technical problem to be solved.

The disclosure aims to provide a display panel and a display device to solve the technical problem of how to increase light output efficiency of the display panel to a large extent and meanwhile reduce influence of a reflected light of ambient light.

A display panel is provided in the disclosure. The display panel is applied to an Organic Light Emitting Diode (OLED). The display panel includes a carrier substrate, multiple light emitting units disposed on the carrier substrate, and multiple light absorbing and reflecting assemblies, where the multiple light absorbing and reflecting assemblies are disposed in correspondence with the multiple light emitting units and each of the multiple light absorbing and reflecting assemblies defines an opening, and where the light absorbing and reflecting assembly is configured to reflect at least part of light emitted by the light emitting unit to radiate through the opening, and further configured to absorb external ambient light.

The light absorbing and reflecting assembly includes a support member, a reflecting member, and a first light-absorbing member which are sequentially stacked along a direction away from the light emitting unit. The support member supports the reflecting member and the first light-absorbing member. The opening penetrates through the reflecting member and the first light-absorbing member. The reflecting member is configured to reflect the at least part of light emitted by the light emitting unit to radiate through the opening. The first light-absorbing member is configured to absorb the external ambient light.

The reflecting member protrudes towards the direction away from the light emitting unit, and a thickness of the reflecting member is between 100 A° and 300 A°.

The support member protrudes towards the direction away from the light emitting unit, and a maximum size of the support member along the direction away from the light emitting unit is between 1 μm and 3 μm.

A thickness of the first light-absorbing member is between 0.5 μm and 1.5 μm.

A length of the opening is between 1 μm and 10 μm, and a width of the opening is between 1 μm and 10 μm.

The light absorbing and reflecting assembly defines one opening, and the one opening is at a vertex of the light absorbing and reflecting assembly away from the light emitting unit; the light absorbing and reflecting assembly defines multiple openings, and the multiple openings surround the vertex of the light absorbing and reflecting assembly away from the light emitting unit; or the light absorbing and reflecting assembly defines multiple openings, one of the multiple openings is at the vertex of the light absorbing and reflecting assembly away from the light emitting unit, and remaining openings surround the vertex of the light absorbing and reflecting assembly away from the light emitting unit.

The light emitting unit includes an anode, a light emitting layer, and a cathode which are electrically coupled in sequence, and further includes a second light-absorbing member. The anode has a first region and a second region disposed at a periphery of the first region, the light emitting layer is disposed in the first region, and the second light-absorbing member is disposed in the second region and configured to absorb the external ambient light.

An orthographic projection of the light absorbing and reflecting assembly on the carrier substrate covers an orthographic projection of the light emitting layer on the carrier substrate.

A display device is further provided in the disclosure. The display device includes the display panel mentioned and a casing which carries the display panel.

In the display panel of the disclosure, the light absorbing and reflecting assembly is disposed in correspondence with the light emitting unit disposed on the carrier substrate. The light absorbing and reflecting assembly is configured to reflect the at least part of light emitted by the light emitting unit to finally radiate through the opening of the light absorbing and reflecting assembly, and further configured to absorb the external ambient light. Firstly, the light absorbing and reflecting assembly can absorb the external ambient light, which can prevent a lot of external ambient light from entering the light emitting unit to be reflected and further avoid adverse effect on a display effect of the display panel. Secondly, the light absorbing and reflecting assembly can further reflect the at least part of light emitted by the light emitting unit to radiate through the opening, which can ensure the light output efficiency of the display panel. Therefore, for the display panel of the disclosure, the light output efficiency of the display panel can be increased to a large extent and meanwhile the influence of the reflected light on the display effect of the display panel can be reduced.

Figure 1:
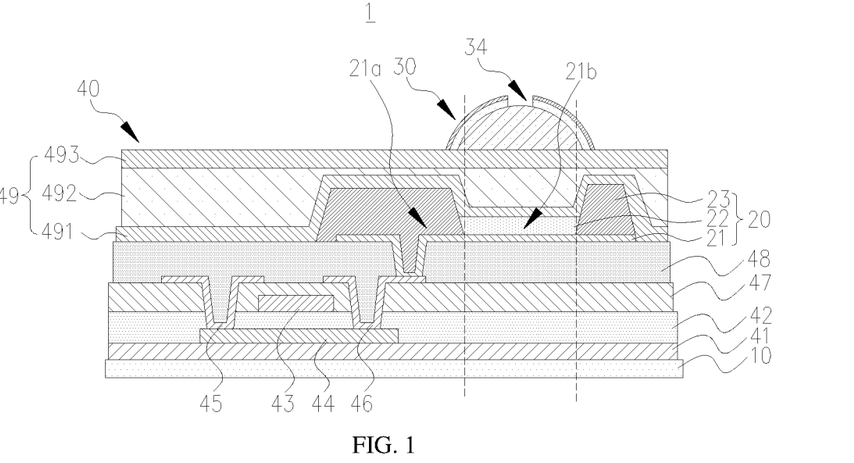
FIG. 1 is a partial cross-sectional structural view of a display panel provided in implementations of the disclosure.

Referring to FIG. 1, FIG. 1 is a partial cross-sectional structural view of a display panel provided in implementations of the disclosure. In the disclosure, a display panel 1 is provided, to increase the light output efficiency of the display panel 1 to a large extent and meanwhile reduce the influence of the reflected light of the ambient light. The display panel 1 provided herein includes but is not limited to an OLED display panel. The display panel 1 includes a carrier substrate 10, multiple light emitting units 20, and multiple light absorbing and reflecting assemblies 30. The multiple light emitting units 20 are disposed on the carrier substrate 10. The multiple light absorbing and reflecting assemblies 30 are disposed in correspondence with the multiple light emitting units 20 and each of the multiple light absorbing and reflecting assemblies 30 defines an opening 34. The light absorbing and reflecting assembly 30 is configured to reflect at least part of light emitted by the light emitting unit 20 to radiate through the opening 34, and further configured to absorb external ambient light.

The light absorbing and reflecting assembly 30 is configured to reflect the at least part of light emitted by the light emitting unit 20. Specifically, the light absorbing and reflecting assembly 30 defines the opening 34, and therefore the at least part of light emitted by the light emitting unit 20 can be radiated through the opening 34. Remaining light emitted by the light emitting unit 20 first is radiated on one side of the light absorbing and reflecting assembly 30 facing the light emitting unit 20, is then reflected between the light absorbing and reflecting assembly 30 and the light emitting unit 20, and is finally radiated through the opening 34 of the light absorbing and reflecting assembly 30. When the external ambient light irradiates on the display panel 1, the external ambient light will be radiated on one side of the light absorbing and reflecting assembly 30 away from the light emitting unit 20 and be absorbed by the light absorbing and reflecting assembly 30.

In the display panel 1 of the disclosure, the light absorbing and reflecting assembly 30 is disposed in correspondence with the light emitting unit 20. The light absorbing and reflecting assembly 30 is configured to reflect the at least part of light emitted by the light emitting unit 20 to radiate through the opening 34 of the light absorbing and reflecting assembly 30. Therefore, the light output efficiency of the display panel 1 can be ensured, then the light brightness of the display panel 1 for display can be further guaranteed. In addition, the light absorbing and reflecting assembly 30 is further configured to absorb the external ambient light, which can prevent a lot of external ambient light from entering the light emitting unit 20 to be reflected and further avoid an adverse effect on the display effect of the display panel 1. As a result, for the display panel 1 of the disclosure, the light output efficiency of the display panel 1 can be increased to a large extent and the influence of the reflected light of the ambient light on the display panel 1 can be reduced.

Figure 2:
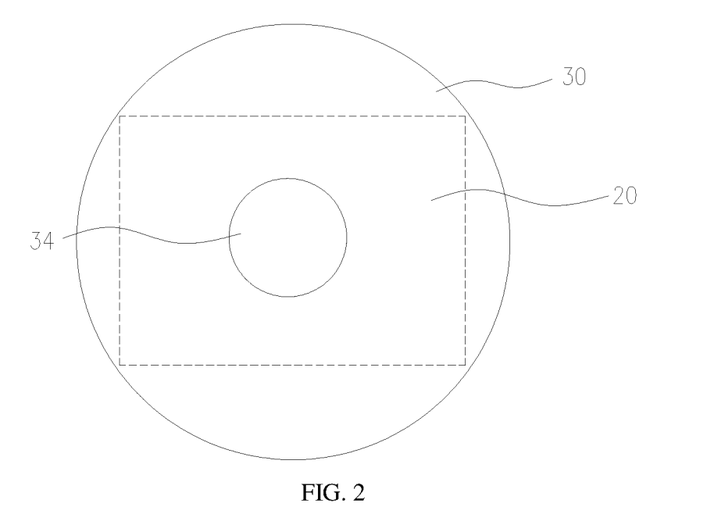
FIG. 2 is a schematic structural view of one light absorbing and reflecting assembly disposed on one light emitting unit provided in the implementations of the disclosure.

Referring to FIG. 2, FIG. 2 is a schematic structural view of one light absorbing and reflecting assembly disposed on one light emitting unit provided in the implementations of the disclosure. In FIG. 2, an example in which the number of light emitting units 20 is one is illustrated, which should not be considered as a limitation on the display panel 1 provided herein. One, two, three or more light emitting units 20 can be disposed on the carrier substrate 10, and the light emitting units 20 arranged in an M*N array can also be disposed on the carrier substrate 10.

Figure 3:
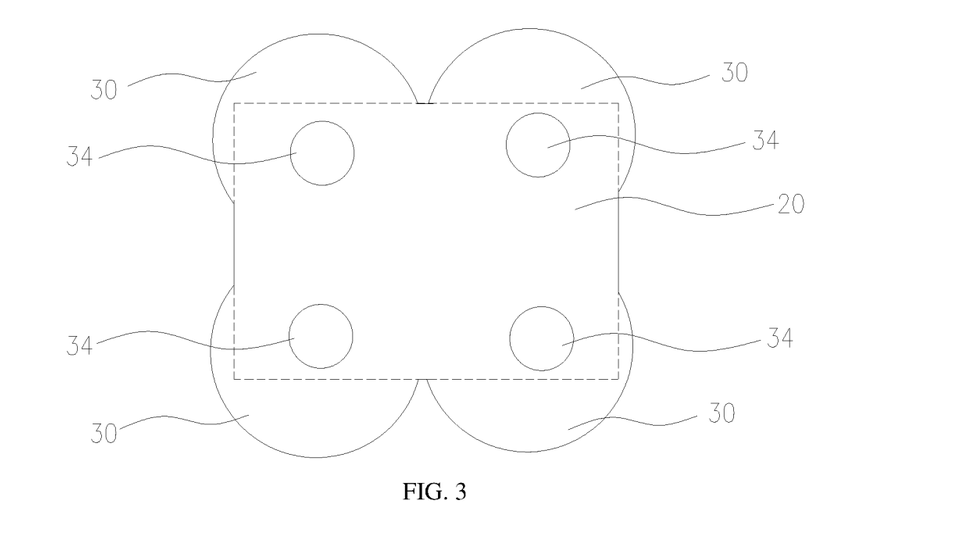
FIG. 3 is a structural view of four light absorbing and reflecting assemblies disposed on one light emitting unit provided in the implementations of the disclosure.

It should be noted that, in the implementation, the one light absorbing and reflecting assembly 30 is disposed on the one light emitting unit 20. In other implementations, multiple light absorbing and reflecting assemblies 30 can also be disposed on one light emitting unit 20, which is not limited herein. For example, FIG. 3 is a structural view of four light absorbing and reflecting assemblies disposed on one light emitting unit provided in the implementations of the disclosure. The disclosure is not limited as long as it can be ensured that the connection between the multiple light absorbing and reflecting assemblies 30 corresponding to the one light emitting unit 20 does not have a light leaking gap.

In the implementation, the carrier substrate 10 may be a flexible substrate. Optionally, the carrier substrate 10 may be made of any one or more of the following materials, i.e., Polyimide (PI), Polyethylene Terephthalate (PET), Polyethylene Naphthalate Two Formic Acid Glycol Ester (PEN), Cyclo-Olefin Polymer (COP), Polycarbonate (PC), Polystyrene (PS), Polypropylene (PP), Polytetrafluoroethylene (PTFE). In other implementations, the carrier substrate 10 may be a non-flexible substrate, such as glass, ceramics, or the like, which is not limited herein.

In the implementation, the light emitting unit 20 may be an OLED. Optionally, in other implementations, the light emitting unit 20 can also be other light emitting devices, such as a Mini Light Emitting Diode (Mini LED), a Micro Light Emitting Diode (Micro LED), or the like, which is not limited herein.

Figure 4:
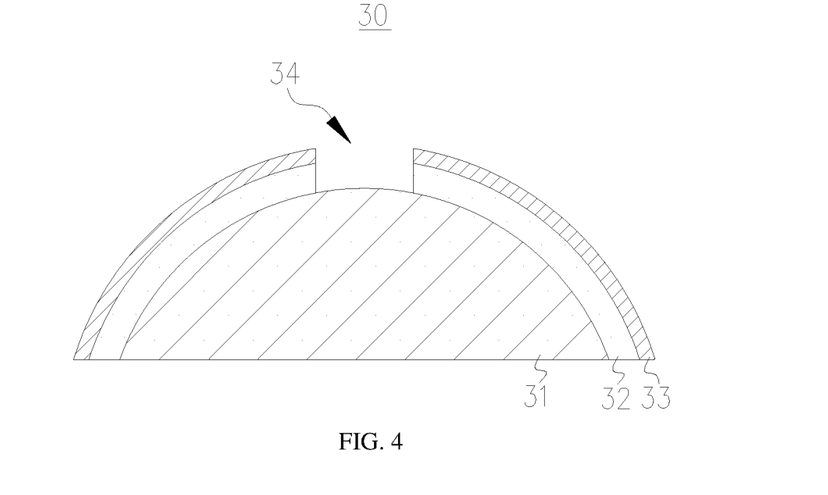
FIG. 4 is a partial cross-sectional structural view of the light absorbing and reflecting assembly provided in the implementations of the disclosure.

Referring to FIG. 4 in combination with FIG. 1, FIG. 4 is a partial cross-sectional structural view of the light absorbing and reflecting assembly provided in the implementations of the disclosure. The light absorbing and reflecting assembly 30 includes a support member 31, a reflecting member 32, and a first light-absorbing member 33 which are sequentially stacked along a direction away from the light emitting unit 20. The support member 31 supports the reflecting member 32 and the first light-absorbing member 33. The opening 34 penetrates through the reflecting member 32 and the first light-absorbing member 33. The reflecting member 32 is configured to reflect the at least part of light emitted by the light emitting unit 20 to radiate through the opening 34. The first light-absorbing member 33 is configured to absorb the external ambient light.

Specifically, the support member 31 supports the reflecting member 32. The light emitted by the light emitting unit 20 is required to pass through the support member 31 to be radiated on the reflecting member 32, then be reflected, and finally be radiated through the opening 34. Thus, the support member 31 is made of transparent materials. Optionally, in the implementation, the support member 31 is made of transparent PI. The transparent PI has many advantages such as good optical properties, low dielectric constant, good thermal stability, and good mechanical properties. In other implementations, the support member 31 may also be made of other types of materials, such as transparent Polymethylmethacrylate (PMMA), transparent PC, as long as the support member 31 can support the reflective member 32 and has good light guide performance, which is not specifically limited in the disclosure. The PMMA is commonly known as acrylics.

It should be noted that, light reflected by the reflecting member 32 not only includes the at least part of light emitted by the light emitting unit 20, but also includes reflected light of the ambient light which is formed by little light from the external environment entering the light emitting unit 20 through the opening 34, and the reflected light is finally exited through the opening 34. Optionally, the material of the reflecting member 32 includes but is not limited to the metal with high reflectivity such as silver and magnesium. In other implementations, the reflecting member 32 can also be made of other types of materials with high reflectivity, which is not limited herein.

The first light-absorbing member 33 is configured to absorb the external ambient light. Optionally, in the implementation, the first light-absorbing member 33 is made of black PI. The black PI has many advantages such as good light blocking properties, good thermal conductivity, good antistatic properties, good electric conduction properties, etc. In other implementations, the first light-absorbing member 33 may also be made of other types of materials, such as black PMMA, black PC, or the like, as long as the first light-absorbing member 33 can absorb the external ambient light and alleviate or even avoid the reflection of the external ambient light, which is not limited herein.

Part of the light emitted by the light emitting unit 20 can be radiated through the opening 34 directly, and another part of the light can be reflected by the reflecting member 32 once or more times and finally be radiated through the opening 34. Compared with the solution using a polarizer in the related technology, the solution provided herein can greatly reduce the loss of the light emission efficiency of the light emitting unit 20. When the external ambient light irradiates on the display panel 1, only little light can be radiated into the light emitting unit 20 through the opening 34 to form reflected light of the external ambient light, and most light will be absorbed by the first light-absorbing member 33. Another part of the external ambient light will be absorbed by the first light-absorbing member 33. In this way, the influence of the external ambient light on the display effect of the display panel 1 can be greatly reduced.

Referring to FIG. 4 again, the reflecting member 32 protrudes towards the direction away from the light emitting unit 20, and a thickness of the reflecting member 32 is between 100 A° and 300 A°.

The reflecting member 32 protrudes towards the direction away from the light emitting unit 20, and the opening 34 is defined at a top of the reflecting member 32, which protrudes towards the direction away from the light emitting unit 20. As such, the light emitted by the light emitting unit 20 can be radiated through the opening 34.

Optionally, according to a cross-sectional structural view of the display panel 1, a shape of the cross section of the reflecting member 32 includes but is not limited to semicircle, parabola, etc., as long as the light emitted by the light emitting unit 20 can finally be radiated through the opening 34, which is not specifically limited herein.

The thickness of the reflecting member 32 is between 100 A° and 300 A°. It need to be noted that, if the thickness of the reflecting member 32 is less than 100 A°, the reflection effect of the reflecting member 32 on the light emitted by the light emitting unit 20 is not enough (that is, the reflecting member 32 cannot reflect effectively all light emitted by the light emitting unit 20; in other words, the reflecting member 32 can only reflect small part of the light emitted by the light emitting unit 20, and another part of the light can be radiated on the first light-absorbing member 33 and be absorbed by the first light-absorbing member 33). Thus, the light output efficiency of the light emitting unit 20 may be reduced, such that the display efficiency of the display panel 1 may be reduced. If the thickness of the reflecting member 32 is greater than 300 A°, the reflecting member 32 can indeed reflect the light emitted by the light emitting unit 20 better. However, a lot of raw materials are needed when the reflecting member 32 with the thickness greater than 300 A° is manufactured. The cost of the reflective member 32 with such a large thickness required for manufacturing the entire display panel 1 is also very high. In a word, when the thickness of the reflecting member 32 is between 100 A° and 300 A°, the light emitted by the light emitting unit 20 can be reflected well, and the cost of the reflecting member 32 can also be controlled well.

In the implementation, the thickness of the reflecting member 32 is between 100 A° and 300 A°. For example, the thickness of the reflecting member 32 is 120 A°, 150 A°, 180 A°, 200 A°, 220 A°, 240 A°, 270 A°, 300 A°, or other values from 100 A° to 300 A°. In other implementations, a range of the thickness of the reflecting member 32 can also be specifically adjusted according to the light emission efficiency and specification of the light emitting unit 20, which is not limited herein.

Referring to FIG. 4 again, the support member 31 protrudes towards the direction away from the light emitting unit 20, and a maximum size of the support member 31 along the direction away from the light emitting unit 20 is between 1 μm and 3 μm.

The support member 31 supports the reflecting member 32. Specifically, the support member 31 is disposed between the reflecting member 32 and the light emitting unit 20, and the reflecting member 32 protrudes towards the direction away from the light emitting unit 20. The support member 31 protrudes towards the direction away from the light emitting unit 20 to support the reflecting member 32, such that the reflecting member 32 can maintain a convex shape.

Optionally, according to the cross-sectional structural view of the display panel 1, a shape of the cross section of the support member 31 includes but is not limited to semicircle, parabola, etc., as long as the shape corresponds to the shape of the reflecting member 32 and can support the reflecting member 32, which is not specifically limited herein.

When the maximum size of the support member 31 along the direction away from the light emitting unit 20 is less than 1 μm, the support member 31 may be unable to support the reflecting member 32 or may not have enough support force. When the maximum size of the support member 31 along the direction away from the light emitting unit 20 is greater than 3 μm, the reflecting member 32 may be curved too much, and thus be damaged.

In the implementation, the maximum size of the support member 31 along the direction away from the light emitting unit 20 is between 1 μm and 3 μm. For example, the maximum size of the support member 31 along the direction away from the light emitting unit 20 may be 1 μm, 1.2 μm, 1.5 μm, 1.7 μm, 1.9 μm, 2.0 μm, 2.1 μm, 2.8 μm, 3.0 μm, or other values from 1 μm to 3 μm. In other implementations, the maximum size of the support member 31 along the direction away from the light emitting unit 20 can also be specifically adjusted according to the shape of the reflecting member 32, which is not limited herein.

Referring to FIG. 4 again, a thickness of the first light-absorbing member 33 is between 0.5 μm and 1.5 μm.

Specifically, the first light-absorbing member 33 is disposed on the reflecting member 32. The first light-absorbing member 33 can be configured to absorb the light irradiated to the display panel 1 from the external environment, to reduce or even avoid the influence on the display efficiency of the display panel 1, which is caused by the reflected light formed by the external ambient light irradiated into the light emitting unit 20.

Optionally, the thickness of the first light-absorbing member 33 is the same everywhere, so as to facilitate preparation. It can be understood that, in other implementations, the thickness of the first light-absorbing member 33 is uneven, as long as the thickness of each part of the first light-absorbing member 33 is between 0.5 μm and 1.5 μm.

The thickness of the first light-absorbing member 33 is between 0.5 μm and 1.5 μm. It need be noted that, if the thickness of the first light-absorbing member 33 is less than 0.5 μm, the effect of the first light-absorbing member 33 on absorbing the external ambient light is not enough (that is, the first light-absorbing member 33 cannot absorb all the light irradiated on the first light-absorbing member 33 from the external environment, or the first light-absorbing member 33 can absorb little of the light irradiated on the first light-absorbing member 33 from the external environment). Thus, much external ambient light is irradiated on the reflecting member 32 through the first light-absorbing member 33 and the reflected light of the ambient light is formed, affecting the display effect of the display panel display panel 1. If the thickness of the first light-absorbing member 33 is greater than 1.5 μm, the first light-absorbing member 33 can indeed absorb the light irradiated from the external environment better. However, a lot of raw materials are needed when the first light-absorbing member 33 with the thickness greater than 1.5 μm is manufactured. The cost of the first light-absorbing member 33 with such a large thickness required for manufacturing the entire display panel 1 is also very high. In a word, when the thickness of the first light-absorbing member 33 is between 0.5 μm and 1.5 μm, the light irradiated from the external environment can be absorbed well, and the cost of the first light-absorbing member 33 can also be controlled well.

In the implementation, the thickness of the first light-absorbing member 33 is between 0.5 μm and 1.5 μm. For example, the thickness of the first light-absorbing member 33 may be 0.5 μm, 0.7 μm, 0.9 μm, 1.0 μm, 1.2 μm, 1.3 μm, 1.4 μm, 1.5 μm, or other values from 0.5 μm to 1.5 μm. In other implementations, the thickness of the first light-absorbing member 33 can also be adjusted according to the specification of the display panel 1, which is not limited herein.

Figure 5:
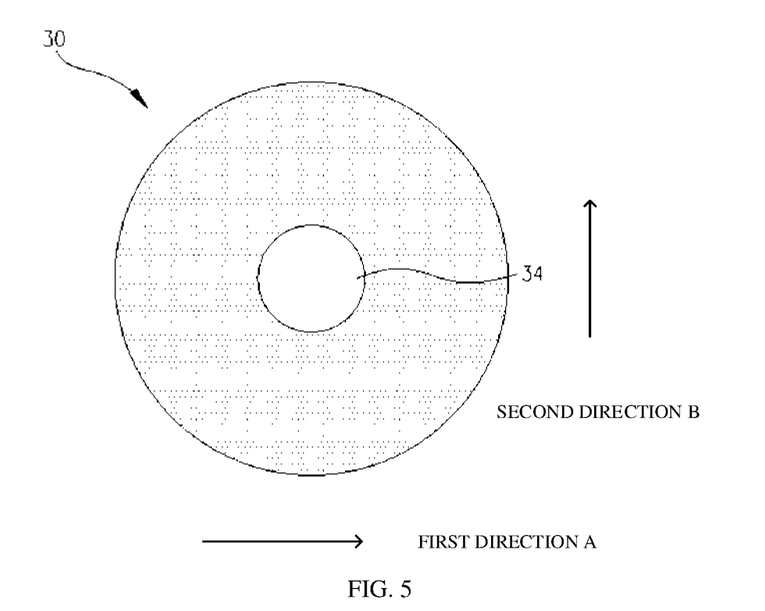
FIG. 5 is a schematic top view of the light absorbing and reflecting assembly provided in the implementations of the disclosure.

Referring to FIG. 5, FIG. 5 is a schematic top view of the light absorbing and reflecting assembly provided in the implementations of the disclosure. A length of the opening 34 is between 1 μm and 10 μm, and a width of the opening 34 is between 1 μm and 10 μm.

In the implementation, the length of the opening 34 is a size of the opening 34 along a first direction A, and the width of the opening 34 is a size of the opening 34 along a second direction B. In other implementations, the length of the opening 34 may also be the size of the opening 34 along the second direction B, the width of the opening 34 may also be the size of the opening 34 along the first direction A. Alternatively, the length and the width of the opening 34 may also be sizes along other directions not illustrated in the drawing, which are not limited herein.

The length of the opening 34 may be but is not limited to 1 μm, 2 μm, 3 μm, 4 μm, 5 μm, 6 μm, 7 μm, 8 μm, 9 μm, 10 μm, or other values from 1 μm to 10 μm.

The width of the opening 34 may be but is not limited to 1 μm, 2 μm, 3 μm, 4 μm, 5 μm, 6 μm, 7 μm, 8 μm, 9 μm, 10 μm, or other values from 1 μm to 10 μm.

The length of the opening 34 is between 1 μm and 10 μm and the width of the opening 34 is between 1 μm and 10 μm, and correspondingly, an area of the opening 34 is between 1 μm$^2$-100 μm$^2$. In the implementation, when the area of the opening 34 is between 1 μm$^2$-100 μm$^2$, it can be ensured that most of the light emitted by the light emitting unit 20 can be radiated through the opening 34. Optionally, the area of the opening 34 may also be 1 μm$^2$, 10 μm$^2$, 20 μm$^2$, 30 μm$^2$, 40 μm$^2$, 50 μm$^2$, 60 μm$^2$, 70 μm$^2$, 80 μm$^2$, 90 μm$^2$, 100 μm$^2$, or other values from 1 μm$^2$ to 100 μm$^2$. In other implementations, the area of the opening 34 can also be adjusted according to the area of the light emitting unit 20, which is not limited herein.

Figure 6:
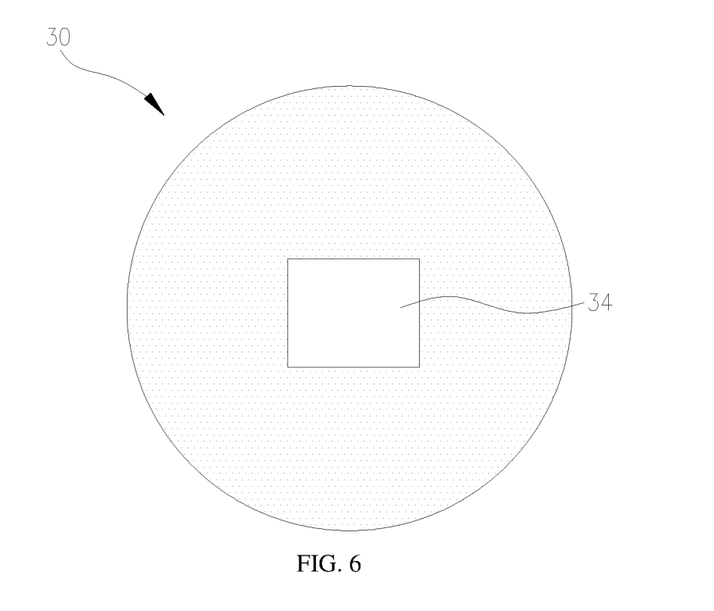
FIG. 6 is a schematic top view of a light absorbing and reflecting assembly provided in implementations of the disclosure.

Optionally, according to the schematic top view of the light absorbing and reflecting assembly 30, the opening 34 may be but is not limited to a circle or the like, which is not limited herein. For example, as illustrated in FIG. 6, FIG. 6 is a schematic top view of a light absorbing and reflecting assembly provided in implementations of the disclosure, where the opening is a rectangle.

The light absorbing and reflecting assembly 30 defines one opening 34, and the one opening 34 is at a vertex of the light absorbing and reflecting assembly 30 away from the light emitting unit 20. Alternatively, the light absorbing and reflecting assembly 30 defines multiple openings 34, and the multiple openings 34 surround the vertex of the light absorbing and reflecting assembly 30 away from the light emitting unit 20. Alternatively, the light absorbing and reflecting assembly 30 defines multiple openings 34, one of the multiple openings 34 is at the vertex of the light absorbing and reflecting assembly 30 away from the light emitting unit 30, and remaining openings 34 surround the vertex of the light absorbing and reflecting assembly 30 away from the light emitting unit 20.

Figure 7:
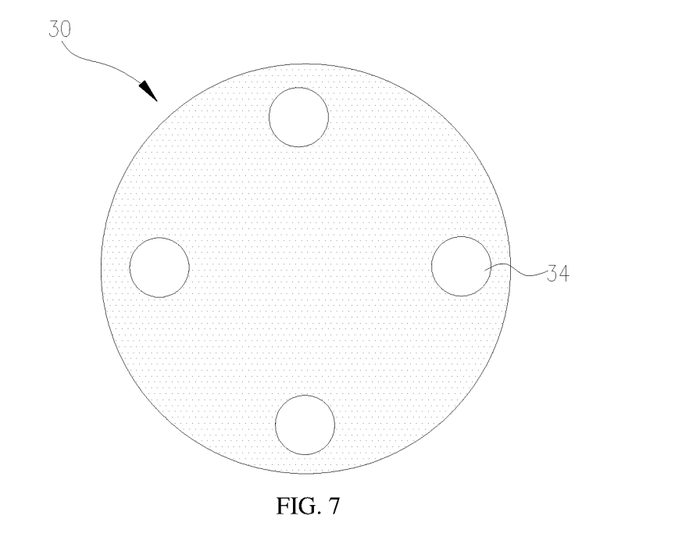
FIG. 7 is a schematic top view of a light absorbing and reflecting assembly provided in implementations of the disclosure.
Figure 8:
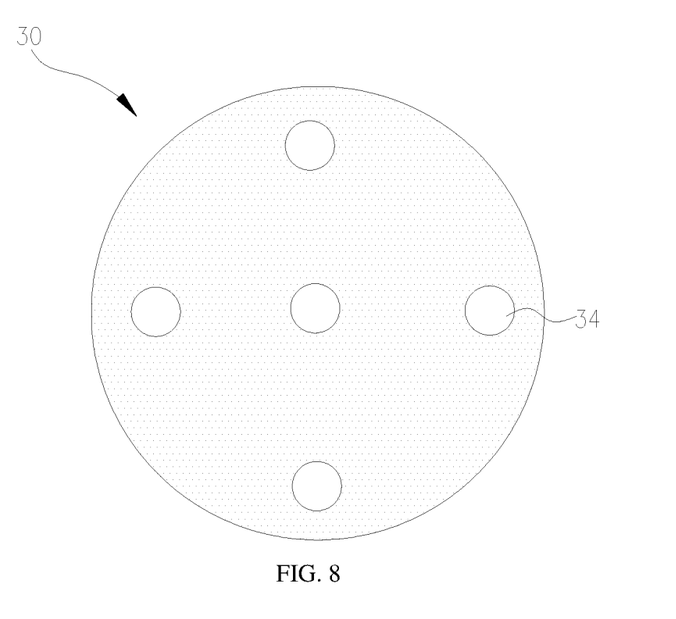
FIG. 8 is a schematic top view of a light absorbing and reflecting assembly provided in implementations of the disclosure.

Specifically, referring to FIG. 7 and FIG. 8, FIG. 7 is a schematic top view of a light absorbing and reflecting assembly provided in implementations of the disclosure, and FIG. 8 is a schematic top view of a light absorbing and reflecting assembly provided in implementations of the disclosure. The light absorbing and reflecting assembly 30 defines multiple openings 34, such that the light emitted by the light emitting unit 20 is radiated through the multiple openings 34, and the light emitted by the light emitting unit 20 is more uniform, improving the display effect of the entire display panel 1. Additionally, the light absorbing and reflecting assembly 30 defines the multiple openings 34, such that the display panel 1 has a wide range of viewable angles.

It need be noted that, if one light absorbing and reflecting assembly 30 defines the multiple openings 34, the total area of the openings 34 is also between 1 μm$^2$ and 100 μm$^2$.

Referring to FIG. 1 again, the light emitting unit 20 includes an anode 21, a light emitting layer 22, and a cathode (not illustrated in the drawing) which are electrically coupled in sequence, and further includes a second light-absorbing member 23. The anode 21 has a first region 21b and a second region 21a disposed at a periphery of the first region 21b, the light emitting layer 22 is disposed in the first region 21b, and the second light-absorbing member 23 is disposed in the second region 21a and configured to absorb the external ambient light.

The size of the opening 34 depends on the size of the light emitting layer 22. Specifically, the larger the light emitting layer 22 is, the larger the area of the opening 34 corresponding to the light emitting layer 22 is, vice versa.

The second light-absorbing member 23 can be configured to absorb the external ambient light. Optionally, in the implementation, the second light-absorbing member 23 may be made of black PI. The black PI has many advantages such as good light blocking properties, good thermal conductivity, good antistatic properties, good electric conduction properties, etc. In other implementations, the second light-absorbing member 23 may also be made of other types of materials, such as black PMMA, black PC, or the like, as long as the second light-absorbing member 23 can absorb the external ambient light and alleviate or even avoid the reflection of the external ambient light, which is not limited herein.

In the implementation, the material of the second light-absorbing member 23 is the same as the material of the first light-absorbing member 33. In other implementations, the material of the second light-absorbing member 23 may be different from the material of the first light-absorbing member 33, which is not limited herein.

Optionally, in the implementation, the anode 21 is made of a totally reflective metal (ITO/Ag/ITO). In other implementations, the anode 21 may be made of other materials, which is not limited herein.

Referring to FIG. 1 again, an orthographic projection of the light absorbing and reflecting assembly 30 on the carrier substrate 10 covers an orthographic projection of the light emitting layer 22 on the carrier substrate 10, such that a lot of external ambient light is prevented from being irradiated into the light emitting unit 20 and thus the reflected light is avoided to be formed on the anode 21.

Referring to FIG. 1 again, the display panel 1 further includes a driving layer 40. The driving layer 40 is disposed on the carrier substrate 10, and the light emitting unit 20 is disposed on the driving layer 40. In other words, the light emitting unit 20 is disposed on the carrier substrate 10 via the driving layer 40. The driving layer 40 is configured to drive the light emitting unit 20 to work.

In the implementation, the driving layer 40 includes a buffer 41. The buffer 41 is disposed on the carrier substrate 10. The buffer 41 is made of silicon-nitrogen compounds, silicon-oxygen compounds, or other materials.

The driving layer 40 further includes a semiconductor layer 44, a gate insulating layer 42, a gate layer 43, an interlayer insulating layer 47, a source 45, and a drain 46. The semiconductor layer 44 is disposed on the buffer 41. The gate insulating layer 42 is disposed on the buffer 41 and covers the semiconductor layer 44, and the gate layer 43 is disposed on one side of the gate insulating layer 42 away from the buffer 41. The interlayer insulating layer 47 covers the gate layer 43. The source 45 and the drain 46 are disposed on the interlayer insulating layer 47 at intervals, the source 45 is coupled to one end of the semiconductor layer 44 via through holes defined by the interlayer insulating layer 47 and the gate insulating layer 42, and the drain 46 is coupled to the other end of the semiconductor layer 44 via through holes defined by the interlayer insulating layer 47 and the gate insulating layer 42.

Optionally, in the implementation, the material of the semiconductor layer 44 may be but is not limited to Poly-Si or metal oxide semiconductor (such as IGZO or ITZO) and so on. The material of the gate insulating layer 42 may be but is not limited to silicon-nitrogen compounds, silicon-oxygen compounds, or other materials, and the material of the gate layer 43 may be but is not limited to copper, aluminum, molybdenum, silver or other conductive materials.

The gate layer 43 is configured to receive a control signal, and control on/off of the source 45 and the drain 46 according to the control signal.

The anode 21 is coupled with the drain 46 and the light emitting layer 22 to receive a driving signal. The driving signal received by the anode 21 and a common signal received by the cathode in the light emitting layer 22 cooperate with each other to drive an electroluminescent layer in the light emitting layer 22 to work.

Optionally, in the implementation, the material of the drain 46 and the source 45 may be but is not limited to copper, aluminum, molybdenum, silver or other conductive materials.

Optionally, in the implementation, the material of the interlayer insulating layer 47 may be but is not limited to silicon-nitrogen compounds, silicon-oxygen compounds, or other materials.

The driving layer 40 further includes a planarization layer 48. The planarization layer 48 is configured to flatten the surface of the driving layer 40, and protect the source 45 and the drain 46.

Optionally, the material of the planarization layer 48 may be but is not limited to PI or other good insulating materials.

Referring to FIG. 1, the driving layer 40 further includes a Thin Film Encapsulation (TFE) layer 49. The TFE layer 49 is disposed on the planarization layer 48. The TFE layer 49 encapsulates the light emitting layer 22, which can prevent the light emitting layer 22 from being affected by water vapor, oxygen, etc. of the external environment.

Optionally, in the implementation, the TFE layer 49 includes a first encapsulation layer 491, an organic layer 492, and a second encapsulation layer 493. The first encapsulation layer 491 is made of a compound of nitrogen, oxygen, and silicon, and the second encapsulation layer 493 is made of silicon-nitrogen compounds. In other implementations, the TFE layer 49 may also be constituted by other layers, the first encapsulation layer 491 and the second encapsulation layer 493 may also be made of other materials, which is not limited herein.

Figure 9:
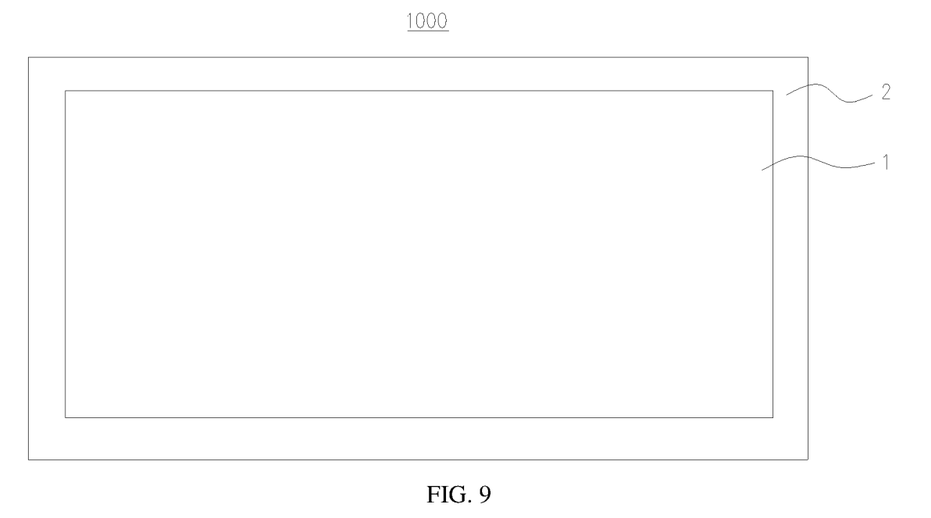
FIG. 9 is a structural view of a display device provided in implementations of the disclosure.

Referring to FIG. 9, FIG. 9 is a structural view of a display device provided in implementations of the disclosure. The display device is provided in the disclosure. The display device includes a casing 2 and the display panel 1. The casing 2 carries the display panel 1.

Optionally, the material of the casing 2 may include but is not limited to plastic or other hard materials, such that the casing 2 can protect the display panel 1 to the greatest extent.

A method for preparing the display panel 1 is further provided in implementations of the disclosure. The method for preparing the display panel 1 can be used to prepare the display panel 1 provided in the implementations of the disclosure. Accordingly, the display panel 1 provided in the implementations of the disclosure can be prepared according to the method for preparing the display panel 1 provided in the implementations of the disclosure.

Figure 10:
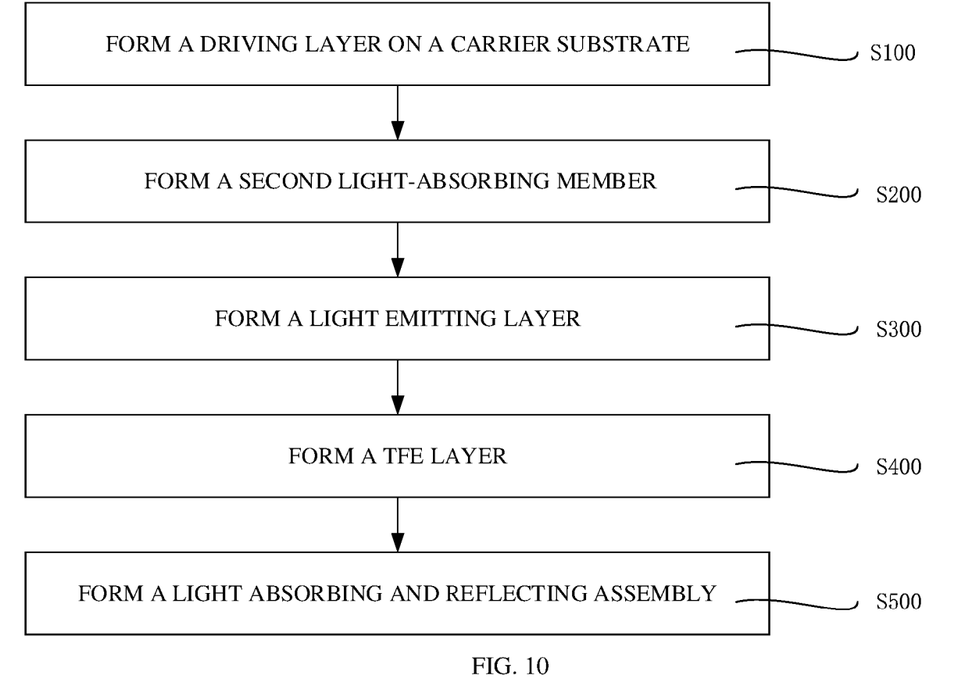
FIG. 10 is a flow chart of preparation of a display device provided in the implementations of the disclosure.

Referring to FIG. 10, FIG. 10 is a flow chart of preparation of a display device provided in the implementations of the disclosure. The method for preparing the display panel 1 includes but is not limited to S100, S200, S300, S400, and S500. The S100, S200, S300, S400, and S500 are described in detail as follows.

S100, form a driving layer 40 on a carrier substrate 10.

In the implementation, the driving layer 40 is formed through film forming, lithography, etching, etc. In other implementations, the driving layer 40 may also be formed through other processes, which is not limited herein. For the specific structure and material of the carrier substrate 10 and the drive layer 40, reference can be made to the above description, which will not be repeated here.

S200, form a second light-absorbing member 23.

Specifically, the second light-absorbing member 23 is formed in the second region 21a of the anode 21, and the second light-absorbing member 23 is configured to absorb the light irradiated from outside.

Optionally, the method for forming the second light-absorbing member 23 includes but is not limited to Physical Vapor Deposition (PVD) and so on.

S300, form a light emitting layer 22.

In the implementation, the light emitting layer 22 includes an electroluminescent layer (not illustrated in the drawing) and a cathode. In other implementations, the light emitting layer 22 further includes a hole transport layer, an electron blocking layer, a hole blocking layer, an electron transport layer, etc. which are sequentially stacked, where the hole transport layer is disposed close to the anode 21, which is not limited herein.

Optionally, the method for forming the light emitting layer 22 includes but is not limited to evaporation.

S400, form a TFE layer 49.

In the disclosure, the TFE layer 49 includes a first encapsulation layer 491, an organic layer 492, and a second encapsulation layer 493. The first encapsulation layer 491 is formed through Chemical Vapor Deposition (CVD), the organic layer 492 is formed through ink-jet printing, the second encapsulation layer 493 is formed through CVD. In other implementations, the first encapsulation layer 491, the organic layer 492, and the second encapsulation layer 493 may also be formed through other technologies, which is not limited herein.

S500, form a light absorbing and reflecting assembly 30.

Specifically, the light absorbing and reflecting assembly 30 is disposed on the TFE layer 49, and is disposed in correspondence with the light emitting layer 22. The light absorbing and reflecting assembly 30 includes a support member 31, a reflecting member 32, and a first light-absorbing member 33 which are sequentially stacked.

Optionally, in the implementation, the support member 31 and the first light-absorbing member 33 is prepared by coating, exposing, and developing, and the reflecting member 32 is prepared by PVD. In other implementations, the support member 31, the reflecting member 32, and the first light-absorbing member 33 may also be prepared by other technologies, which is not limited herein.

The above are some implementations of the disclosure. It should be noted that for those of ordinary skill in the art, without departing from the principles of the implementations of the disclosure, some improvements and embellishments can be made, which also falls within the protection scope of the disclosure.

What is claimed is:

1. A display panel, comprising:
a carrier substrate;
a plurality of light emitting units disposed on the carrier substrate; and
a plurality of light absorbing and reflecting assemblies disposed in correspondence with the plurality of light emitting units, wherein each of the plurality of light absorbing and reflecting assemblies has an arc-shaped cross section and defines a plurality of openings, and wherein the light absorbing and reflecting assembly is configured to reflect at least part of light emitted by the light emitting unit to radiate through the plurality of openings, and to absorb external ambient light, wherein the plurality of openings surround a vertex of the light absorbing and reflecting assembly away from the light emitting unit, or one of the plurality of openings is at the vertex of the light absorbing and reflecting assembly away from the light emitting unit and remaining openings of the plurality of openings surround the vertex of the light absorbing and reflecting assembly away from the light emitting unit.

2. The display panel of claim 1, wherein the light absorbing and reflecting assembly comprises a support member, a reflecting member, and a first light-absorbing member which are sequentially stacked along a direction away from the light emitting unit, the support member supports the reflecting member and the first light-absorbing member, the plurality of openings penetrates through the reflecting member and the first light-absorbing member, the reflecting member is configured to reflect the at least part of light emitted by the light emitting unit to radiate through the plurality of openings, and the first light-absorbing member is configured to absorb the external ambient light.

3. The display panel of claim 2, wherein the reflecting member protrudes towards the direction away from the light emitting unit, and a thickness of the reflecting member is between 100 A° and 300 A°.

4. The display panel of claim 2, wherein the support member protrudes towards the direction away from the light emitting unit, and a maximum size of the support member along the direction away from the light emitting unit is between 1 μm and 3 μm.

5. The display panel of claim 2, wherein a thickness of the first light-absorbing member is between 0.5 μm and 1.5 μm.

6. The display panel of claim 2, wherein a length of each of the plurality of openings is between 1 μm and 10 μm, and a width of each of the plurality of openings is between 1 μm and 10 μm.

7. The display panel of claim 2, wherein each of the reflecting member and the support member has an arc-shaped cross section.

8. The display panel of claim 1, a total area of the plurality of openings is between 1 μm$^2$ and 100 μm$^2$.

9. The display panel of claim 1, wherein
the light emitting unit comprises an anode, a light emitting layer, and a cathode which are electrically coupled in sequence, and a second light-absorbing member; and
the anode has a first region and a second region disposed at a periphery of the first region, the light emitting layer is disposed in the first region, and the second light-absorbing member is disposed in the second region and configured to absorb the external ambient light.

10. The display panel of claim 9, wherein an orthographic projection of the light absorbing and reflecting assembly on the carrier substrate covers an orthographic projection of the light emitting layer on the carrier substrate.

11. A display device, comprising a display panel and a casing carrying the display panel, the display panel comprising:
a carrier substrate;

a plurality of light emitting units disposed on the carrier substrate; and a plurality of light absorbing and reflecting assemblies disposed in correspondence with the plurality of light emitting units, wherein each of the plurality of light absorbing and reflecting assemblies has an arc-shaped cross section and defines a plurality of openings, and wherein the light absorbing and reflecting assembly is configured to reflect at least part of light emitted by the light emitting unit to radiate through the plurality of openings, and to absorb external ambient light, wherein the plurality of openings surround a vertex of the light absorbing and reflecting assembly away from the light emitting unit, or one of the plurality of openings is at the vertex of the light absorbing and reflecting assembly away from the light emitting unit and remaining openings of the plurality of openings surround the vertex of the light absorbing and reflecting assembly away from the light emitting unit.

12. The display device of claim 11, wherein the light absorbing and reflecting assembly comprises a support member, a reflecting member, and a first light-absorbing member which are sequentially stacked along a direction away from the light emitting unit, the support member supports the reflecting member and the first light-absorbing member, the plurality of openings penetrates through the reflecting member and the first light-absorbing member, the reflecting member is configured to reflect the at least part of light emitted by the light emitting unit to radiate through the plurality of openings, and the first light-absorbing member is configured to absorb the external ambient light.

13. The display device of claim 12, wherein the reflecting member protrudes towards the direction away from the light emitting unit, and a thickness of the reflecting member is between 100 A° and 300 A°.

14. The display device of claim 12, wherein the support member protrudes towards the direction away from the light emitting unit, and a maximum size of the support member along the direction away from the light emitting unit is between 1 μm and 3 μm.

15. The display device of claim 12, wherein a thickness of the first light-absorbing member is between 0.5 μm and 1.5 μm.

16. The display device of claim 12, wherein a length of each of the plurality of openings is between 1 μm and 10 μm, and a width of each of the plurality of openings is between 1 μm and 10 μm.

17. The display device of claim 11, a total area of the plurality of openings is between 1 μm$^2$ and 100 μm$^2$.

18. The display device of claim 12, wherein each of the reflecting member and the support member has an arc-shaped cross section.

* * * * *